(12) United States Patent
Lin

(10) Patent No.: US 7,675,381 B2
(45) Date of Patent: Mar. 9, 2010

(54) MODULIZED WAVE FILTER

(75) Inventor: Cheng-I Lin, Beimen Township, Tainan County (TW)

(73) Assignee: Soontai Tech Co., Ltd., Tainan (TW)

( * ) Notice: Subject to any disclaimer, the term of this patent is extended or adjusted under 35 U.S.C. 154(b) by 56 days.

(21) Appl. No.: 12/000,345

(22) Filed: Dec. 12, 2007

(65) Prior Publication Data

US 2009/0153263 A1 Jun. 18, 2009

(51) Int. Cl.
*H01P 1/10* (2006.01)
(52) U.S. Cl. .......................... 333/101; 333/262
(58) Field of Classification Search .................. None
See application file for complete search history.

(56) References Cited

U.S. PATENT DOCUMENTS 5,278,907 A * 1/1994 Snyder et al. ............... 380/274
5,991,416 A * 11/1999 Bae ............................. 380/39

* cited by examiner

*Primary Examiner*—Robert Pascal
*Assistant Examiner*—Kimberly E Glenn
(74) *Attorney, Agent, or Firm*—Rosenberg, Klein & Lee

(57) ABSTRACT

A wave filter is installed in a multimedia wideband router, and includes a circuit board having a first low-pass wave-filtering circuit, and a band-pass wave-filtering circuit; the band-pass wave-filtering circuit consists of a high-pass wave-filtering circuit and a second low-pass wave-filtering circuit; the first low-pass wave-filtering circuit is connected to the high-pass wave-filtering circuit; the circuit board further includes an input terminal, and a first switching component, which is movable to such a position as to electrically connect the input terminal and a joint between the first low-pass wave-filtering circuit and the high-pass wave-filtering circuit; the circuit board further includes two output terminals, which are connected to the first and the second low-pass wave-filtering circuits respectively; a second switching component is provided on the circuit board, which is movable to such a position as to electrically connect the high-pass wave-filtering circuit and the second low-pass wave-filtering circuit.

4 Claims, 2 Drawing Sheets

MODULIZED WAVE FILTER

BACKGROUND OF THE INVENTION

1. Field of the Invention

The present invention relates to a wave filer, more particularly one, which is modulized, and fitted in a multimedia wideband router, and which includes a circuit board with several wave-filtering circuits, and switching components interposed between the wave-filtering circuits to control the wave filter; therefore, it isn't necessary to change wave filters and install additional switching components in order for the multimedia wideband router to be connected to and used with televisions/various digital multimedia equipments.

2. Brief Description of the Prior Art

It is a development trend of home networking to combine various digital devices with computers and digital multimedia equipments. Wireless Local Area Network (WLAN for short), Ultra-wideband (UWB), HomePlug, and the Multimedia over Coax Alliance (MoCA) are among the currently existing techniques of home networking. The Multimedia over Coax Alliance was established by its founding members in January 2004, and develops specifications for home networking over in-home co-axial cable. The goal of the Multimedia over Coax Alliance is to facilitate home networking on existing coaxial cable, which can be used for data connections to telephones, network, set top boxes, cable TV (CATV), Satellite Master Antenna Television System (SMATV), Wireless Local Area Network (WLAN) and other entertainment devices without the need for new connections.

However, the following problems will arise when the MoCA networking technique is used; a multimedia wideband router for the above purpose has to be connected to various wave filters with different wave-filtering effects, which are used to filter various signals sent though the coaxial cable in order to obtain signals of needed frequency bands as well as signals of the frequency band between 975 MHz and 1525 MHz stipulated by Multimedia over Coax Alliance (MoCA). Therefore, it is necessary to change wave filters or install additional switching components on the multimedia wideband router in order for the multimedia wideband router to be connected to and used with televisions/various digital multimedia equipments, causing a lot of inconvenience.

Therefore, it t is a main object of the present invention to provide a modulized wave filter to overcome the above problems.

SUMMARY OF THE INVENTION

A wave filter according to an embodiment of the present invention includes a circuit board, which has a first low-pass wave-filtering circuit, and a band-pass wave-filtering circuit consisting of both a high-pass wave-filtering circuit and a second low-pass wave-filtering circuit. The circuit board further includes input and output terminals, and switching components between the wave-filtering circuits. The wave filter is fitted in a multimedia wideband router therefore it isn't necessary to change wave filters and install additional switching components in order for the multimedia wideband router to be connected to and used with televisions/various digital multimedia equipments. In other words, the present wave filter is more practical and convenient to use.

BRIEF DESCRIPTION OF THE DRAWINGS

The present invention will be better understood by referring to the accompanying drawings, wherein.

DETAILED DESCRIPTION OF THE PREFERRED EMBODIMENTS

Figure 1:
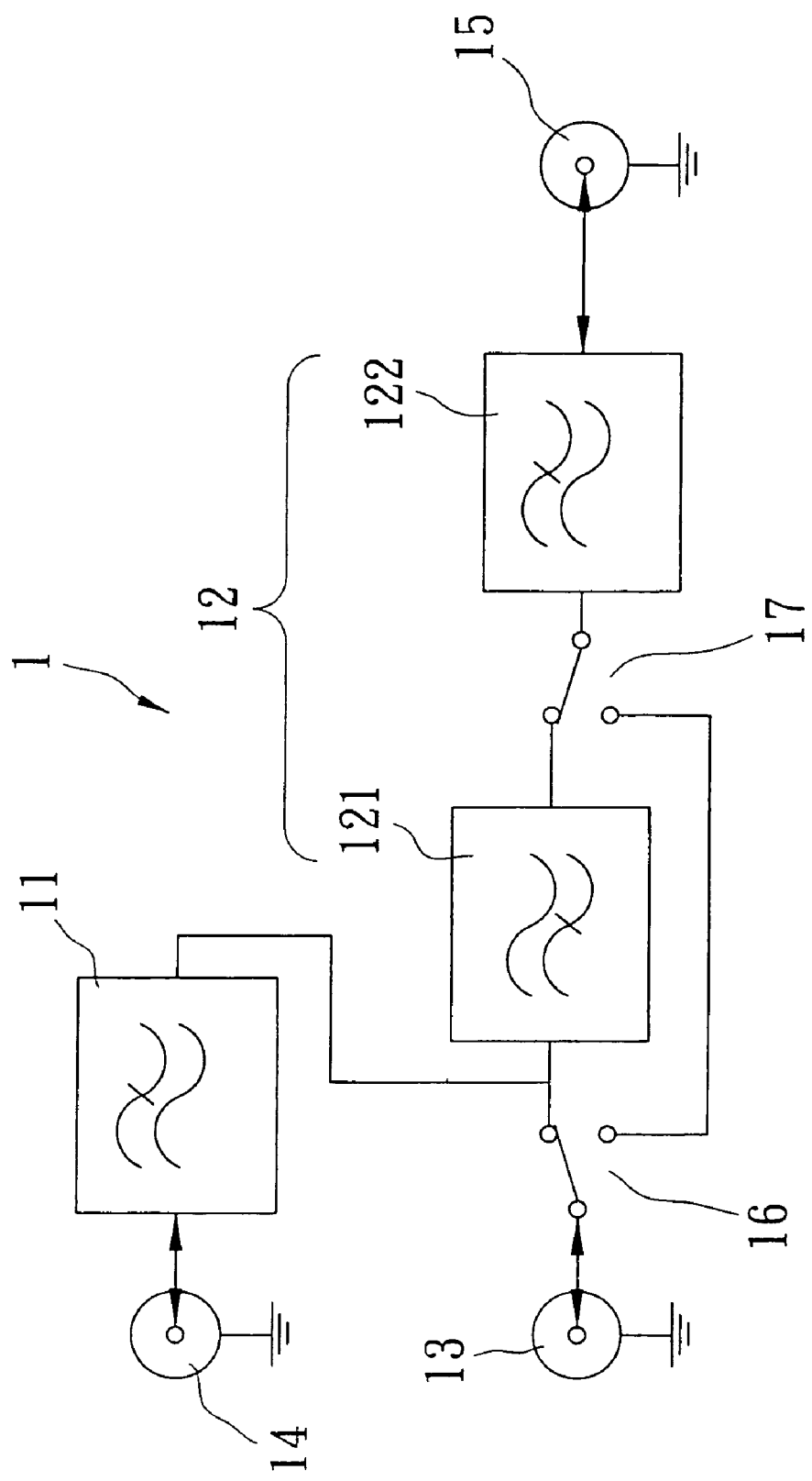
FIG. 1 is a structural view of the modulized wave filter of the present invention.

Referring to FIG. 1, a preferred embodiment of a modulized wave filter of the present invention includes a circuit board 1. The circuit board 1 includes a low-pass wave-filtering circuit 11, and a band-pass wave-filtering circuit 12, which consists of a high-pass wave-filtering circuit 121, and a low-pass wave-filtering circuit 122.

The low-pass wave-filtering circuit 11 is connected to the high-pass wave-filtering circuit 121. And, the circuit board 1 further includes an input terminal 13, and a first switching component 16, which is fitted on the input terminal 13, and can be moved to such a position as to electrically connect the input terminal 13 and the joint between the low-pass wave-filtering circuit 11 and the high-pass wave-filtering circuit 121. The circuit board 1 further includes two output terminals 14 and 15, which are connected to the low-pass wave-filtering circuits 11 and 122 respectively.

Furthermore, the circuit board 1 includes a switching component 17, which is interposed between the high-pass wave-filtering circuit 121 and the low-pass wave-filtering circuit 122, and can be moved to a connecting position to electrically connect the high-pass wave-filtering circuit 121 and the low-pass wave-filtering circuit 122. Therefore, the wave filter is modulized.

The modulized wave filter of the present invention is fitted in and connected at the input terminal 13 thereof to a multimedia wideband router, with the output terminal 14 being connected to a television for cable TV (CATV) signals to be outputted, and the output terminal 15 being connected to other circuits in the multimedia wideband router so as to output signals conforming to the standard of use stipulated by Multimedia over Coax Alliance (MoCA). When the switching components 16 and 17 are moved to such a position as to connect the input terminal 13, the low-pass wave-filtering circuit 11, and the high-pass wave-filtering circuit 121 together, and to connect both the high-pass wave-filtering circuit 121 and the low-pass wave-filtering circuit 122 together, signals inputted through the input terminal 13 will pass through the low-pass wave-filtering circuit 11 with high-frequency signals being filtered out; thus, low-frequency signals such as cable TV (CATV) signals are outputted through the output terminal 14. At the same time, signals inputted through the input terminal 13 will pass through the band-pass wave-filtering circuit 12 with high-frequency signals and low-frequency ones being filtered out by the low-pass wave-filtering circuit 122 and the high-pass wave-filtering circuit 121; thus, signals of a frequency band are outputted through the output terminal 15, e.g. signals of the frequency band between 975 MHz and 1525 MHz stipulated by Multimedia over Coax Alliance (MoCA).

Figure 2:
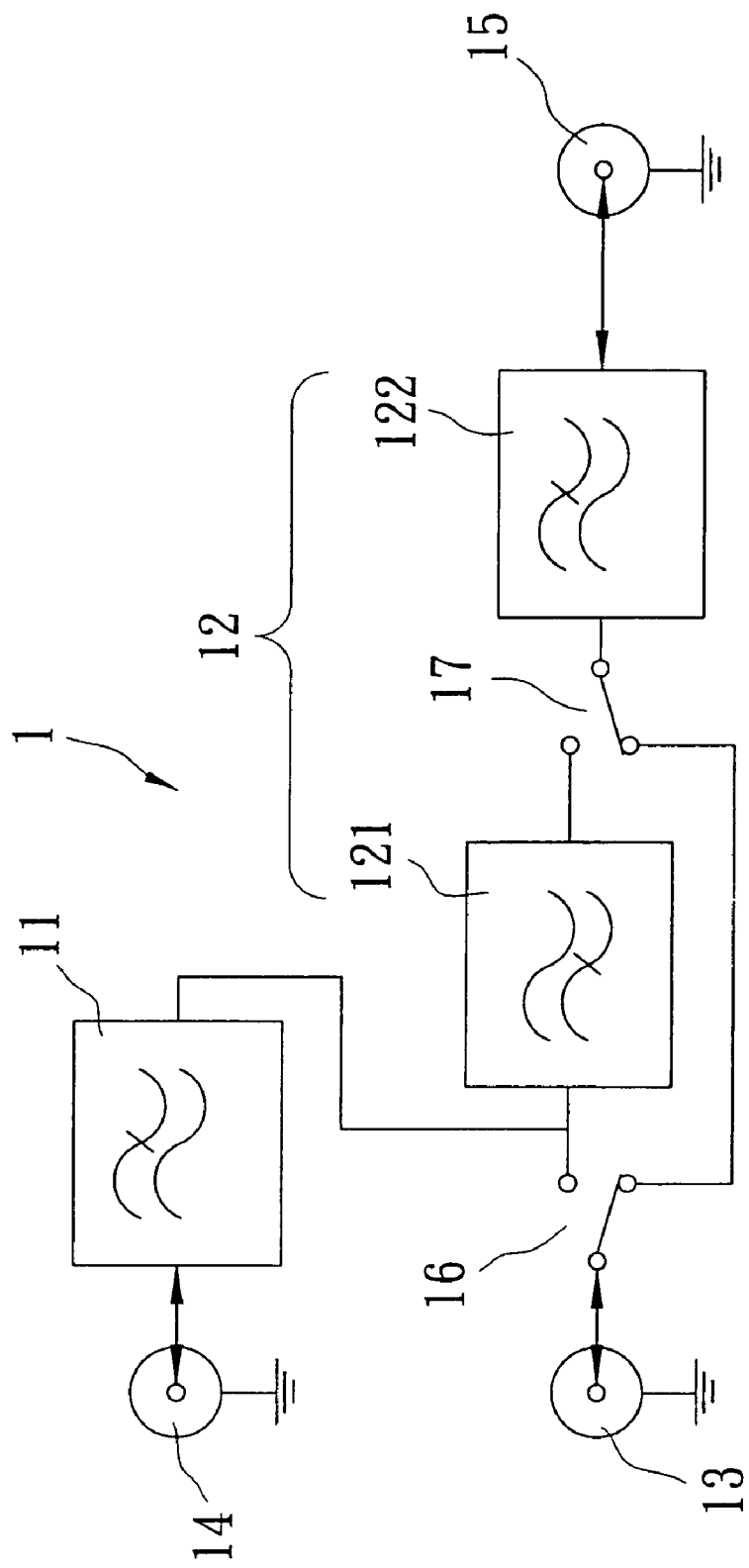
FIG. 2 is a structural view of the present invention in use.

Referring to FIG. 2, when the switching components 16 and 17 are moved to such a position as to make the input terminal 13 directly connected to the low-pass wave-filtering circuit 122, signals inputted through the input terminal 13 will pass through the low-pass wave-filtering circuit 122 with high-frequency signals being filtered out; thus, low-frequency signals are outputted through the output terminal 15, e.g. the low-frequency signals conforming to the stipulation by Multimedia over Coax Alliance (MoCA). Therefore, it is not necessary to change wave filters and install additional switching components in order for allowing the multimedia wideband router to be connected to and used with televisions or various digital multimedia equipments.

From the above description, it can be seen that the wave filter of the present invention has an advantage over the prior art: the wave filter is modulized, consisting of a low-pass wave-filtering circuit, a band-pass wave-filtering circuit, which includes a high-pass wave-filtering circuit, and a second low-pass wave-filtering circuit, and switching components between the wave-filtering circuits, and is positioned in a multimedia wideband router with the input terminal being connected to the multimedia wideband router, and with both the output terminals being connected to a television and another circuit in the multimedia wideband router respectively; therefore, because of the modulized wave filter of the present invention, it is not necessary to change wave filters and install additional switching components in order for allowing the multimedia wideband router to be connected to and used with televisions or various digital multimedia equipments.

What is claimed is:

1. A modulized wave filter, comprising:
    a circuit board, the circuit board including a first low-pass wave-filtering circuit; the circuit board including a band-pass wave-filtering circuit consisting of both a high-pass wave-filtering circuit and a second low-pass wave-filtering circuit;
    the first low-pass wave-filtering circuit being connected to the high-pass wave-filtering circuit;
    the circuit board including an input terminal directly coupled to a first switching component; wherein the first switching component is movable to a selective position for electrically connecting the input terminal and a node between the first low-pass wave-filtering circuit and the high-pass wave-filtering circuit;
    the circuit board including two output terminals, which are connected to the first and the second low-pass wave-filtering circuits respectively;
    the circuit board including a second switching component movable to a selective position for electrically connecting the high-pass wave-filtering circuit and the second low-pass wave-filtering circuit.

2. The modulized wave filter as claimed in claim 1, wherein the second output terminal outputs a frequency band between 975 MHz and 1525 MHz.

3. A modulized wave filter for a multimedia wideband router defined in a circuit board, comprising:
    a first and second switching component;
    a band-pass wave-filtering circuit, the band-pass wave-filtering circuit defining a selectably switchable high-pass wave-filtering circuit and a second low-pass wave-filtering circuit, wherein the second switching component is switchable to electrically connect or bypass the high-pass wave-filtering circuit to the second low-pass wave-filtering circuit;
    a first low-pass wave-filtering circuit, the first low-pass wave-filtering circuit being connected to the high-pass wave-filtering circuit forming a node;
    a first and second output terminal, the first and second output terminals being connected to the first and second low-pass wave-filtering circuits respectively; and
    an input terminal directly coupled to the first switching component, the first switching component switchable to electrically connect or bypass the node between the first low-pass wave-filtering circuit and the high-pass wave-filtering circuit.

4. The modulized wave filter as claimed in claim 3, wherein the second output terminal outputs a frequency band between 975 MHz and 1525 MHz.

* * * * *